(12) United States Patent
Bito (10) Patent No.: US 8,067,788 B2
(45) Date of Patent: Nov. 29, 2011

(54) SEMICONDUCTOR DEVICE

(75) Inventor: Yasunori Bito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 394 days.

(21) Appl. No.: 12/061,065

(22) Filed: Apr. 2, 2008

(65) Prior Publication Data

US 2008/0237638 A1    Oct. 2, 2008

(30) Foreign Application Priority Data

Apr. 2, 2007    (JP) ................... 2007-096411

(51) Int. Cl.
    *H01L 31/072*    (2006.01)

(52) U.S. Cl. ........ 257/192; 257/155; 257/194; 257/195; 257/267; 257/280; 257/392; 257/E27.061; 257/E27.068; 257/E29.317

(58) Field of Classification Search ............... 257/155, 257/192, 194, 195, 267, 280, 392, E27.061, 257/E27.068, E29.317
    See application file for complete search history.

(56) References Cited

U.S. PATENT DOCUMENTS

| | | | | |
|---|---|---|---|---|
| 5,514,605 | A | * | 5/1996 | Asai et al. ............... 438/172 |
| 5,834,802 | A | * | 11/1998 | Takahashi et al. ........ 257/280 |
| 6,078,067 | A | * | 6/2000 | Oikawa ................... 257/192 |
| 6,166,404 | A | * | 12/2000 | Imoto et al. ............. 257/279 |
| 2002/0003245 | A1 | * | 1/2002 | Kato et al. ............... 257/279 |
| 2005/0110054 | A1 | * | 5/2005 | Wohlmuth ................ 257/267 |
| 2005/0263789 | A1 | * | 12/2005 | Hwang .................... 257/194 |

FOREIGN PATENT DOCUMENTS

| | | |
|---|---|---|
| JP | 61-59781 | 3/1986 |
| JP | 6-216326 | 8/1994 |
| JP | 6-326131 | 11/1994 |
| JP | 7-142685 | 6/1995 |
| JP | 2773700 | 4/1998 |

\* cited by examiner

*Primary Examiner* — Andy Huynh
(74) *Attorney, Agent, or Firm* — Young & Thompson (57) ABSTRACT

A semiconductor device includes a substrate common to a first field effect transistor and a second field effect transistor, a channel layer of a first conductivity type formed on the substrate and common to the first and second field effect transistors, a an upper compound semiconductor layer formed on the channel layer and common to the first and second field effect transistors, a compound semiconductor region of a second conductivity type formed in the same layer as the upper compound semiconductor layer, a gate electrode of the first field effect transistor in ohmic contact with the compound semiconductor region, and a gate electrode of the second field effect transistor in Schottky contact with the upper compound semiconductor layer.

15 Claims, 11 Drawing Sheets

PRIOR ART

Fig. 11

SEMICONDUCTOR DEVICE

BACKGROUND OF THE INVENTION

1. Field of the Invention

The present invention relates to a semiconductor device, and more particularly to a semiconductor device in which different types of field effect transistors are monolithically integrated.

2. Description of Related Art

Recent years technologies relating to semiconductor integrated circuits for mobile communication terminals have been progressing further. As performances of semiconductor integrated circuits for mobile communication terminals become higher, it is strongly demanded to monolithically integrate functional elements thereof.

By monolithically integrating functional elements, it is achieved to miniaturize the chip itself and to simplify bonding operation and so on.

Enhancement-mode FETs (field effect transistors) are used as power amplifier circuits for mobile communication terminals. This is because that it is required for power amplifier circuits to operate sharing a common power supply with other functional circuits. Meanwhile, depletion-mode FETs are used as switching circuits in mobile communication terminals. This is because that it is required for switching circuits to lower on-resistance thereof in order to realize low insertion loss.

Monolithic integration of enhancement-mode FETs and depletion-mode FETs is well known in the related art (Japanese Unexamined Patent Application Publication Nos. H07-142685, H06-216326, H06-326131, S61-59781 and Japanese Patent No. 2773700).

Depletion-mode FETs have a negative threshold voltage. Enhancement-mode FETs, on the other hand, have a positive threshold voltage. Therefore, it is required to set the threshold voltage different between the depletion-mode FET and the enhancement-mode FET.

Figure 11:
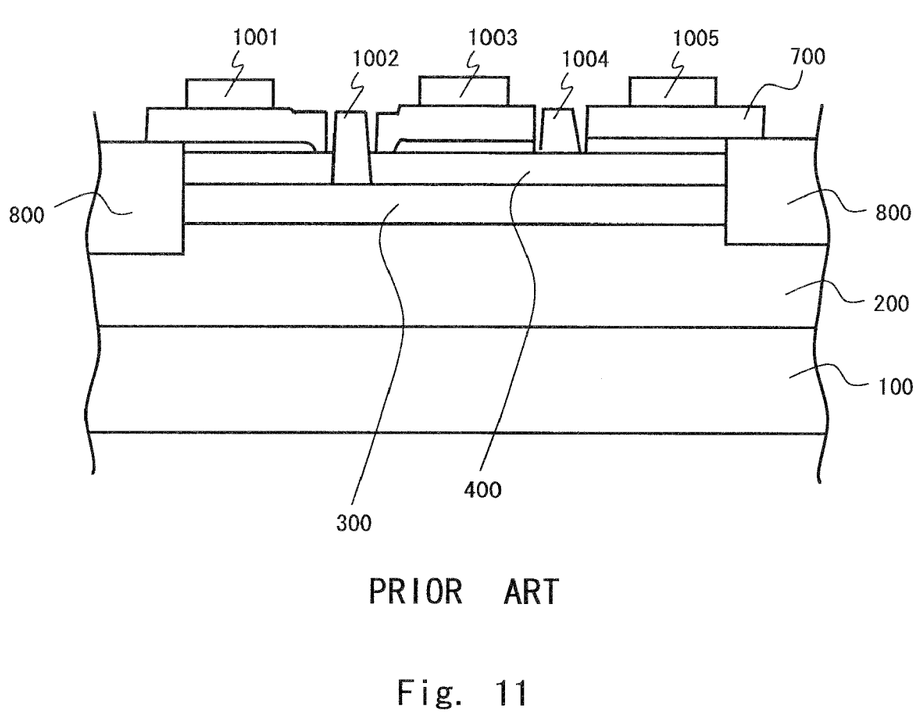
FIG. 11 is a schematic diagram for the explanation of prior art.

FIG. 11 is a schematic diagram for explaining the technology described in Japanese Unexamined Patent Application Publication No. H07-142685. In FIG. 11, the distance between a gate electrode 1002 of an enhancement-mode FET to a channel layer 200 is shorter, by the thickness of an n-type GaAs layer 400, than the distance between a gate electrode 1004 of a depletion-mode FET to the channel layer 200. The difference between threshold voltages of the enhancement-mode FET and the depletion-mode FET is determined based on the difference in distance between the gate electrodes and channel layer. Japanese Unexamined Patent Application Publication Nos. H06-216326, H06-326131, S61-59781 and Japanese Patent No. 2773700 disclose the same technology as Japanese Unexamined Patent Application Publication No. H07-142685 above.

Japanese Unexamined Patent Application Publication No. S61-59781 discloses a semiconductor device in which a Schottky barrier-type FET, and a pn-junction-type FET which have the same junction depth and impurity concentration in channel regions are monolithically integrated.

It has now been discovered that using an enhancement-mode FET as a FET for a power amplifier circuit sufficiently reduces power consumption during non-operation of the power amplifier circuit, and hence that the threshold voltage may be set to a positive voltage greater than +0.3 V (more preferably, to a positive voltage greater than +0.4 V). Also, using a depletion-mode FET as a FET for a switching circuit allows sufficiently reducing insertion loss, and hence the threshold voltage may be set to a negative voltage greater than −0.5 V (more preferably, to a negative voltage greater than −0.6 V). The above settings result in a greater difference (differential voltage) between the threshold voltage of the enhancement-mode FET and the threshold voltage of the depletion-mode FET (more preferably, a differential voltage of 1V(=+0.4−(−0.6 V)).

In order to set such a large differential voltage, the gate-channel layer distance in the depletion-mode FET must be set to be sufficiently greater than the gate-channel layer distance in the enhancement-mode FET.

According to Japanese Unexamined Patent Application Publication No. H07-142685, the layer thickness of the above-described n-type GaAs layer 400 must be set to 50 nm. As the thickness of the GaAs layer becomes thicker, the gate of the enhancement-mode FET is to be arranged inside the semiconductor device. In this way, Electric fields converge in the gate, thereby decreasing the breakdown voltage of the gate. This precludes using such a FET as a FET for a power amplifier circuit in which a large voltage is applied to the gate. Even though providing a space on the side faces of the gate for increasing the breakdown voltage characteristics of the gate, it may result in decreased drain current and/or increased on-resistance.

In semiconductor devices having different types of FET monolithically integrated therein it is thus difficult to set optimal characteristics for each FET in accordance with the intended application.

SUMMARY

In one embodiment, a semiconductor device includes a substrate common to a first field effect transistor and a second field effect transistor, a channel layer of a first conductivity type formed on the substrate and common to the first and second field effect transistors, a an upper compound semiconductor layer formed on the channel layer and common to the first and second field effect transistors, a compound semiconductor region of a second conductivity type formed in the same layer as the upper compound semiconductor layer, a gate electrode of the first field effect transistor in ohmic contact with the compound semiconductor region, and a gate electrode of the second field effect transistor in Schottky contact with the upper compound semiconductor layer.

A first field effect transistor has a gate electrode connected to a compound semiconductor region of a second conductivity type. A second field effect transistor has a gate electrode in Schottky contact with an upper compound semiconductor layer. As a result, the potential barriers at the gates of the two transistors are set to dissimilar values. The threshold voltage difference between the first field effect transistor and the second field effect transistor is therefore set including the potential barrier difference between the gates of the two transistors, in addition to the layer thickness of the upper compound semiconductor layer. A large difference between the threshold voltage of the first field effect transistor and the threshold voltage of the second field effect transistor can thus be set without setting an excessively large layer thickness in the upper compound semiconductor layer. As a result, the first field effect transistor and the second field effect transistor can be optimized for their respective applications.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
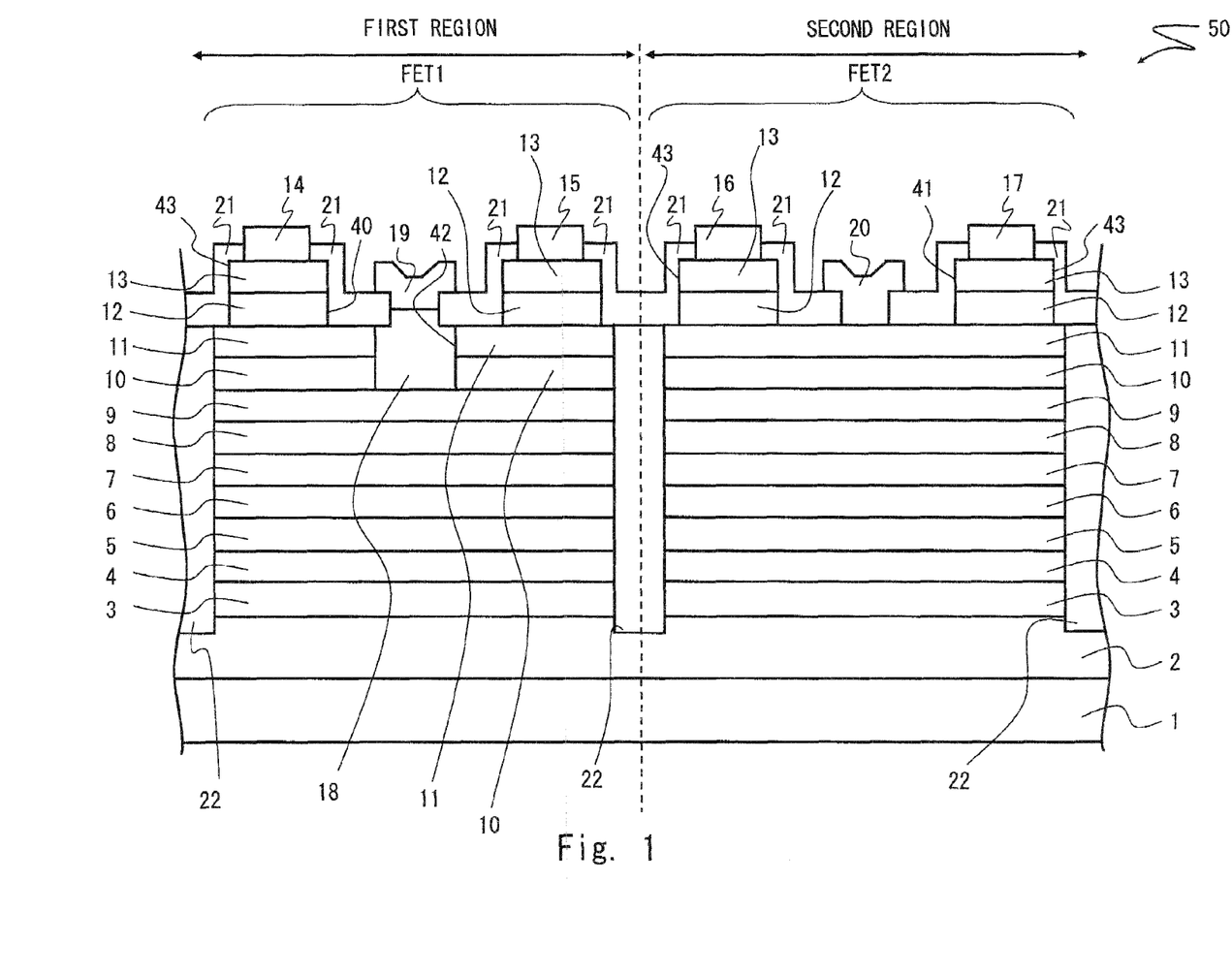
FIG. 1 is a schematic diagram for explaining schematically the cross-sectional configuration of a semiconductor device 50 according to a first embodiment.

A semiconductor device 50 according to a first embodiment is explained next with reference to FIG. 1. FIG. 1 is a schematic diagram for explaining schematically the cross-sectional configuration of the semiconductor device 50. The configuration of the semiconductor device 50 will be explained first.

As illustrated in FIG. 1, the semiconductor device 50 has a first field effect transistor (FET 1) in a first region, and a second field effect transistor (FET 2) in a second region. The FET 1 is an enhancement-mode FET having a positive threshold voltage. The FET 1 is part of a power amplifier circuit. The FET 2 is a depletion-mode FET, having a negative threshold voltage. The FET 2 is part of a switching circuit. In other words, the semiconductor device 50 is a semiconductor integrated circuit in which a power amplifier circuit and a switching circuit are monolithically integrated, with the FET 1 of the power amplifier circuit, the FET 2 for the switching circuit and so forth provided on a same substrate.

The field effect transistors FET 1 and FET 2 are so-called high electron mobility transistors (HEMTs) having an electron supply layer and a channel layer of mutually different materials. The electron supply layer is a layer for supplying electrons. The channel layer is a layer through which the electrons move. In the present embodiment there is provided also a spacer layer between the electron supply layer and the channel layer, with a view to enhancing electron mobility.

As illustrated in FIG. 1, the semiconductor device 50 comprises a semi-insulating GaAs substrate (compound semiconductor substrate) 1, and formed thereon, through epitaxial growth, a layered body of group III-V compound semiconductor layers including for instance, in this order, a buffer layer (AlGaAs layer) 2, an electron supply layer (AlGaAs layer) 3, a spacer layer (AlGaAs layer) 4, a channel layer (InGaAs layer) 5, a spacer layer (AlGaAs layer) 6, an electron supply layer (AlGaAs layer) 7, an interlayer (AlGaAs layer) 8, an interlayer (GaAs layer) 9, a stopper layer (InGaP layer) 10, an interlayer (upper compound semiconductor layer) (GaAs layer) 11, a stopper layer (AlGaAs layer) 12, a cap layer (GaAs layer) 13.

The buffer layer 2 is an undoped AlGaAs layer of 500 nm thickness. The electron supply layer 3 is an n-type AlGaAs layer of 4 nm thickness, doped with $2 \times 10^{18}$ cm$^{-3}$ impurities (Si). The spacer layer 4 is an undoped AlGaAs layer of 2 nm thickness. The channel layer 5 is an undoped InGaAs layer of 15 nm thickness. The spacer layer 6 is an undoped AlGaAs layer of 2 nm thickness. The electron supply layer 7 is an n-type AlGaAs layer of 10 nm thickness, doped with $2 \times 10^{18}$ cm$^{-3}$ impurities (Si). The interlayer 8 is an undoped n-type AlGaAs layer of 5 nm thickness. The interlayer 9 is an undoped GaAs layer of 5 nm thickness. The stopper layer 10 is an undoped InGaP layer of 5 nm thickness. The interlayer 11 is an undoped GaAs layer of 15 nm thickness. The stopper layer 12 is an n-type AlGaAs layer of 5 nm thickness, doped with $4 \times 10^{18}$ cm$^{-3}$ impurities (Si). The cap layer 13 is an n-type GaAs layer of 100 nm thickness, doped with $4 \times 10^{18}$ cm$^{-3}$ impurities (Si).

The above compound semiconductor layers 2 to 13 are sequentially layered on the GaAs substrate 1 by ordinary thin-film formation technologies (such as MOCVD (Metal Organic Chemical Vapor Deposition) or the like). A layered body of the compound semiconductor layers 2 to 13 is formed thus on the GaAs substrate 1.

As illustrated in FIG. 1, the FET 1 has a source electrode 14 and a drain electrode 15. The source electrode 14 and the drain electrode 15 are AuGe—Ni—Au alloy layers formed on the cap layer 13. Similarly, the FET 2 has a source electrode 16 and a drain electrode 17. The source electrode 16 and the drain electrode 17 are AuGe—Ni—Au alloy layers formed on the cap layer 13. The source electrodes and drain electrodes of the FET 1 and the FET 2 are formed after the formation of a surface protective layer 21.

A first recess 40 is formed by etching on the first region. The first recess 40 is formed at a portion between the areas where the source electrode 14 and the drain electrode 15 are to be formed. The first recess 40 is a groove formed by partially removing the cap layer 13 and the stopper layer 12. The stopper layer 12 functions as an etching stop layer for the first recess 40.

A first recess 41 is formed by etching on the second region. The first recess 41 is formed at a portion between the areas where the source electrode 16 and the drain electrode 17 are to be formed. In the same way as the first recess 40, the first recess 41 is a groove formed by partially removing the cap layer 13 and the stopper layer 12. The stopper layer 12 functions as an etching stop layer for the first recess 41.

A second recess 42 is formed by etching in the first recess 40. The second recess 42 is a groove formed by partially removing the interlayer 11 and the stopper layer 10. The stopper layer 10 functions as an etching stop layer for the second recess 42. Unlike the first recess 40, no second recess is formed in the first recess 41.

A compound semiconductor layer (compound semiconductor region) 18 doped with impurities of a second conductivity type are formed by selective regrowth in the second recess 42. The compound semiconductor layer 18 is a p-type GaAs (p$^+$-GaAs) layer doped with impurities (C) and having a thickness of 80 nm. The impurity concentration in the compound semiconductor layer 18 is about $1\times10^{20}$ cm$^{-3}$. The impurity concentration of the second conductivity-type semiconductor layer 18 is preferably higher than the impurity concentration of the n-type AlGaAs layer 7. If the impurity concentration is equal to or lower than that of the n-type AlGaAs layer 17, the width of the depletion layer in the second conductivity-type semiconductor layer 18 increases, which is undesirable.

A gate electrode 19 of the FET 1 is formed on the compound semiconductor layer 18. The gate electrode 19, which is made of WSi, is in ohmic contact with the compound semiconductor layer 18. In other words, the gate electrode 19 is an ohmic electrode. A PN-junction is formed between the p-type second conductivity-type semiconductor layer 18 and the n-type AlGaAs layer 7. Switching of the FET 1 to ON/OFF is controlled by modulating the electron accumulation in the channel layer 5 through control of the thickness of the depletion layer extending from the PN-junction towards the channel layer, as a result of voltage applied to the gate electrode 19.

A gate electrode 20 of the FET 2 is formed on the interlayer 11. The gate electrode 20, like the gate electrode 19, is made of WSi. Unlike the gate electrode 19, the gate electrode 20 is in Schottky contact with the interlayer 11. In other words, the gate electrode 20 is a Schottky electrode. A Schottky barrier forms between the gate electrode 20 and the interlayer 11. Switching on and off in the FET 2 is controlled by controlling the thickness of the depletion layer of the Schottky junction, through voltage applied to the gate electrode 20.

The FET 1 and the FET 2 are electrically separated by an isolation region 22. The isolation region 22 is formed by ion implantation of impurities (boron (B)) into the bottom of a recess 43 formed by removing the stopper layer 12, the cap layer 13 and so forth.

A surface protective film (passivation film) 21 is formed on the top face of the layered body comprising the compound semiconductor layers 2 to 13. The surface protective film 21 is a SiO$_2$ film formed using ordinary thin-film formation technologies (sputtering or the like). As illustrated in FIG. 1, the respective electrodes of the FET 1 and the FET2 are formed by removing partially the surface protective film 21.

As is clear from the above explanation, in the present embodiment the gate electrode 19 of the FET 1 is connected to the p-type compound semiconductor layer 18, while gate electrode 20 of the FET 2 is connected to the n-type interlayer 11. As a result, the gate potential barriers of the two FETs are set to dissimilar values. Specifically, the potential barrier ($\phi_E$) of the gate of the FET 1 is set to 1.4 eV, corresponding to the bandgap of the compound semiconductor layer (p$^+$-GaAs layer) 18. Meanwhile, the gate potential barrier ($\phi_D$) of the FET 2 is set to 0.8 eV, resulting from the Schottky junction between the gate electrode 20 and the interlayer 11. This allows, as a result, setting as a result a sufficiently large value for the threshold voltage difference between the FET 1 and the FET 2 while making the interlayer 11 and the stopper layer 10 sufficiently thin. This makes the characteristics of the FET 1 suitable for a FET for a power amplifier circuit, and the characteristics of the FET 2 suitable for a FET for a switching circuit.

The above feature is further explained next. The difference ($\Delta V_T$) between the threshold voltage of the enhancement-mode FET 1 and the threshold voltage of the depletion-mode FET 2 is given by Equation 1. The depletion layer extending in the compound semiconductor layer (p$^+$-GaAs layer) 18 is sufficiently thin and hence negligible.

$$\Delta V_T = \kappa_1 \cdot t_{GaAs} + \kappa_2 \cdot t_{InGaP} + ((\phi_E - \phi_D)/q) \qquad \text{Equation 1}$$

In the equation, $\kappa_1$ is the electric field intensity in the interlayer (GaAs layer) 11, $\kappa_2$ is the electric field intensity in the stopper layer (InGaP layer) 10, $t_{GaAs}$ the thickness of the interlayer (GaAs layer) 11, $t_{InGaP}$ is the thickness of the stopper layer (InGaP layer) 10 and q is the elementary charge.

The first term ($\kappa_1 \cdot t_{GaAs}$) and the second term ($\kappa_2 \cdot t_{InGaP}$) in Equation 1 are the threshold voltage difference between the FET 1 and the FET 2 for the total sum value of the layer thickness of the interlayer 11 and the layer thickness of the stopper layer 10. The total sum value of the layer thickness of the interlayer 11 and the layer thickness of the stopper layer 10 corresponds to the difference between the distance between the gate structure of the FET 1 (gate electrode 19, compound semiconductor layer 18) and the channel layer 5, and the distance between the gate structure of the FET 2 (gate electrode 20) and the channel layer 5. The third term (($\phi_E - \phi_D$)/q) in Equation 1 is the threshold voltage difference resulting from the difference between the potential barrier ($\phi_E$) of the gate of the FET 1 and the potential barrier ($\phi_D$) of the gate of the FET 2.

As described above, thus, the potential barriers of the FET 1 and the FET 2 are set to different values. Therefore, the threshold voltage difference between the FET 1 and the FET 2 can be set to 0.6 V (1.4−0.8($\phi_E - \phi_D$)) in the third term. Hence, it is no longer necessary to set a threshold value difference larger by 0.6 V in the first and second terms. That is, the stopper layer 10 and the interlayer 11 need not be thick.

As a result, the threshold voltage difference between the FET 1 and the FET 2 can be set to 1 V (i.e., the threshold voltage of the FET 1 can be set to +0.4 V and the threshold voltage of the FET 2 to −0.6 V) without excessively increasing the layer thickness of the stopper layer 10 and the interlayer 11. In this case, as described above, it is sufficient to set the layer thickness of the stopper layer 10 to 5 nm and the layer thickness of the interlayer 11 to 20 nm.

Results of prototype evaluation showed that the gate breakdown voltage of the FET 1 can be set to 18 V. This characteristic is sufficient for power amplifier circuits operating at 3 V in mobile communication terminals. Also, the cutoff current is extremely small, of 5 nA/mm, since the threshold voltage of the FET 1 is higher than +0.3 V. The gate barrier ($\phi_E$) of the FET 1 is high, which allows applying a large gate voltage to the gate electrode 19. A substantial value of maximum drain current, of 430 mA/mm, could thus be obtained for the enhancement-mode FET 1.

Because threshold voltage of FET2 is low (−0.6V), a sufficiently low value (1.6 Ωmm) as the on-resistance for FET2 is obtained.

Setting different values for the potential barriers in the gates of the FET 1 and the FET 2 allows thus setting a sufficiently large value for the threshold voltage difference between the FET 1 and the FET 2, without thickening the interlayer 11 and the stopper layer 10. This makes the characteristics of the FET 1 suitable for a FET for a power amplifier circuit, and the characteristics of the FET 2 suitable for a FET for a switching circuit.

Lastly, an example of a manufacturing method of the semiconductor device 50 is succinctly explained next. Firstly there is prepared the GaAs substrate 1. The buffer layer 2 to the cap layer 13 are grown then by MOCVD on the GaAs substrate 1. The first recess 40 and the recess 43 are formed then through etching. An impurity (boron (B)) is driven then into the bottom of the recess 43, to form the isolation region 22. The second recess 42 is formed next. The compound semiconductor layer 18 is selectively deposited then in the second recess 42. The surface protective film 21 is formed next. The source electrodes 14, 16 and the drain electrodes 15, 17 are formed then, followed by formation of the gate electrodes 19, 20.

Second Embodiment

Figure 2:
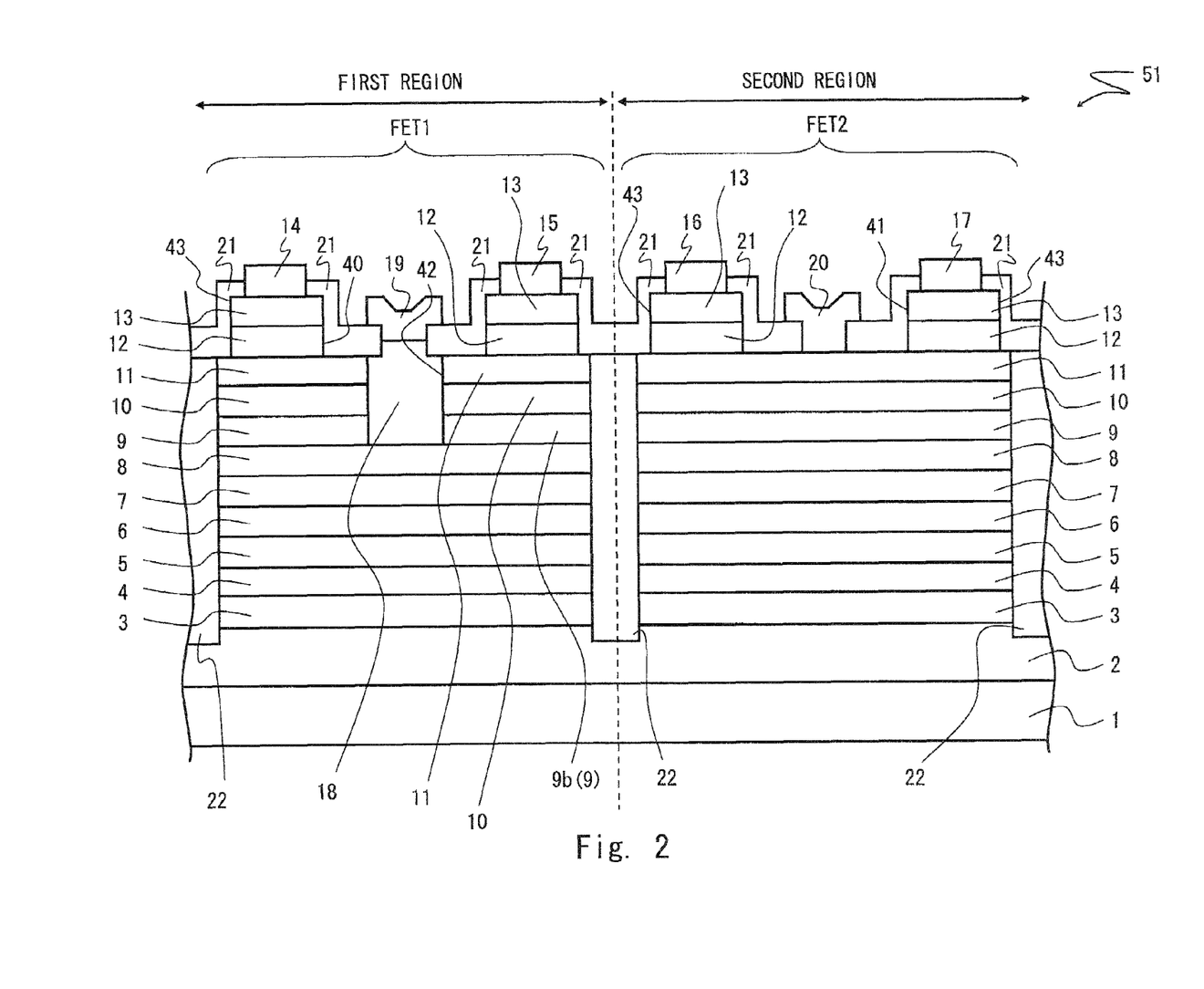
FIG. 2 is a schematic diagram for explaining schematically the cross-sectional configuration of a semiconductor device 51 according to a second embodiment.

A semiconductor device 51 according to a second embodiment is explained next with reference to FIG. 2. FIG. 2 is a schematic diagram for explaining schematically the cross-sectional configuration of the semiconductor device 51.

In the present embodiment, as illustrated in FIG. 2, the compound semiconductor layer 18 is formed in a second recess 42 that is formed in the interlayer 11, the stopper layer 10 and the interlayer 9. That is, the compound semiconductor layer 18 is provided on top of the interlayer 8. In this case as well there is obtained the same effect as in the first embodiment.

Results of prototype evaluation showed that the threshold voltage of the FET 1 was +0.5 V and the cutoff current 1 nA/mm. The total sum value of the layer thickness of the interlayer 11 to the interlayer 9 in the FET 1 was 25 nm, while the gate breakdown voltage of the FET 1 was 16 V. The threshold voltage of the FET 2 was the same as in the first embodiment, of −0.6 V.

Third Embodiment

Figure 3:
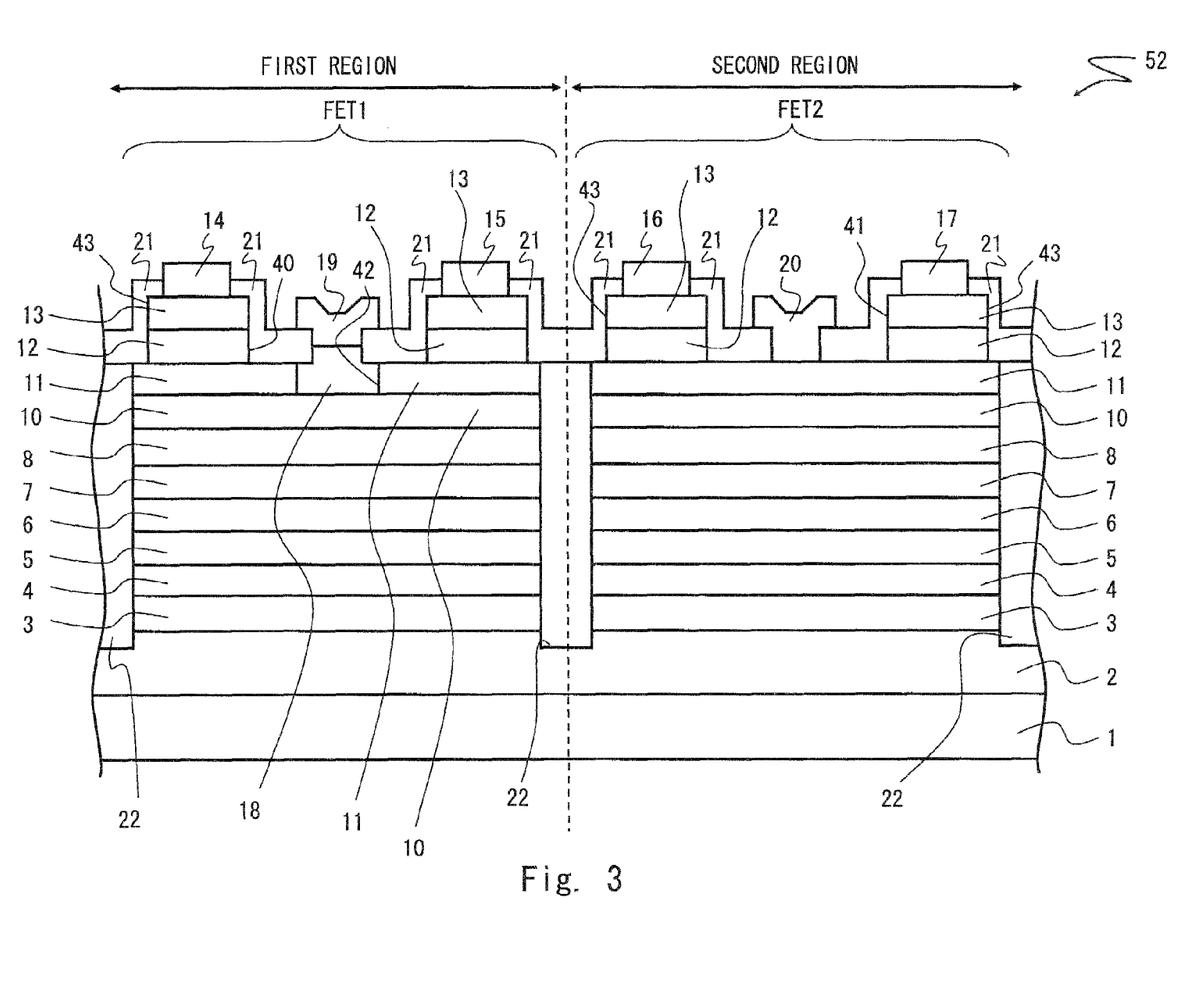
FIG. 3 is a schematic diagram for explaining schematically the cross-sectional configuration of a semiconductor device 52 according to a third embodiment.

A semiconductor device 52 according to a third embodiment is explained next with reference to FIG. 3. FIG. 3 is a schematic diagram for explaining schematically the cross-sectional configuration of the semiconductor device 52.

In the present embodiment, as illustrated in FIG. 3, the compound semiconductor layer 18 is formed in the second recess 42 formed in the interlayer 11. That is, the compound semiconductor layer 18 is provided on top of the stopper layer 10. In this case as well there is obtained the same effect as in the first embodiment. The layer thickness of the interlayer 11 is set to 20 nm. No interlayer 9 is interposed in this case.

Results of prototype evaluation showed that the threshold voltage of the FET 1 was +0.4 V and the cutoff current 5 nA/mm. The layer thickness of the interlayer 11 of the FET 1 was 20 nm, while the gate breakdown voltage of the FET 1 was 18V. The threshold voltage of the FET 2 was the same as in the first embodiment, of −0.6 V.

Fourth Embodiment

Figure 4:
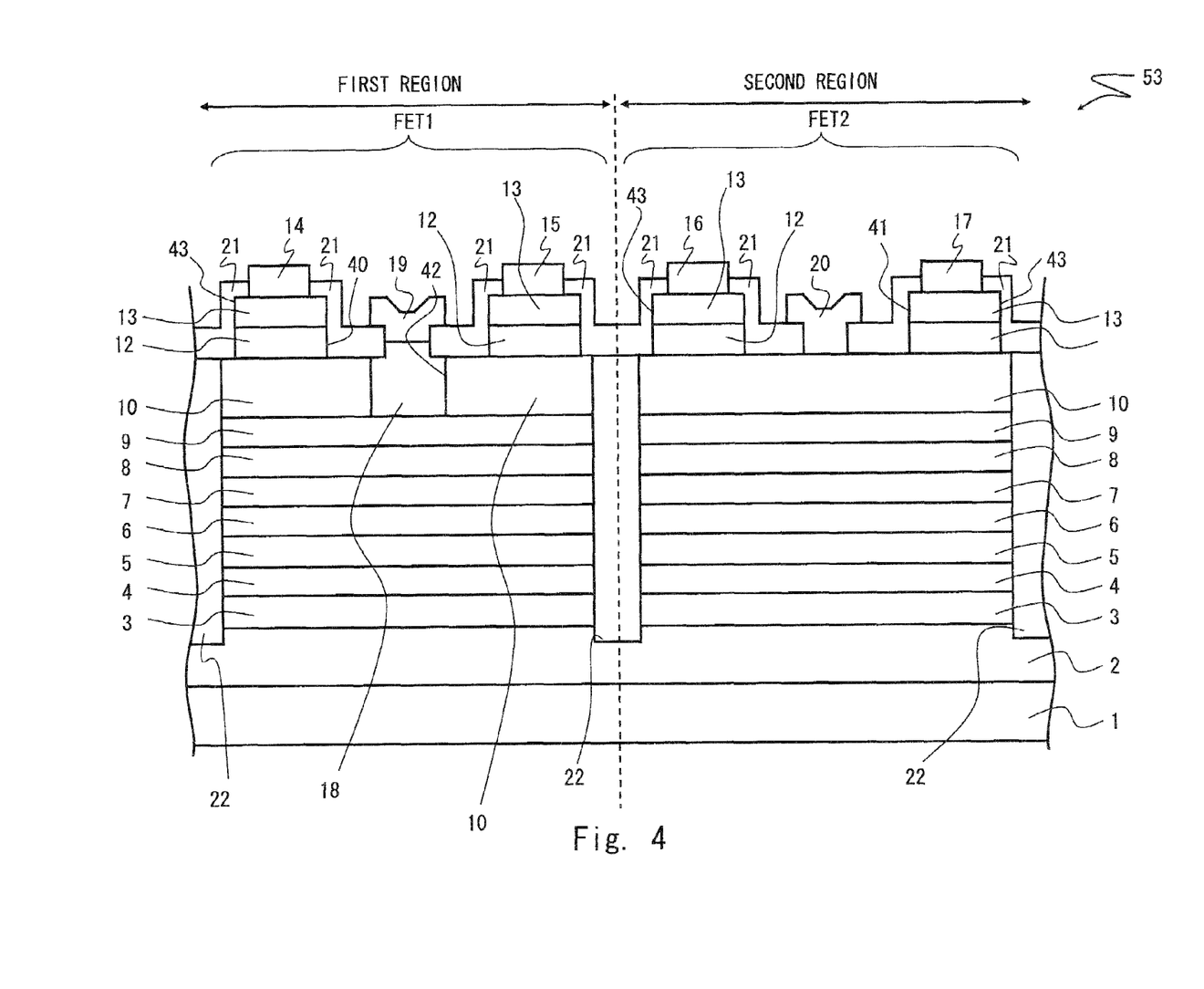
FIG. 4 is a schematic diagram for explaining schematically the cross-sectional configuration of a semiconductor device 53 according to a fourth embodiment.

A semiconductor device 53 according to a fourth embodiment is explained next with reference to FIG. 4. FIG. 4 is a schematic diagram for explaining schematically the cross-sectional configuration of the semiconductor device 53.

In the present embodiment, as illustrated in FIG. 4, the gate electrode 20 is in Schottky contact with the InGaP layer (stopper layer) 10. In this case there is obtained the same effect as in the third embodiment. Herein, the InGaP layer (stopper layer) 10 is equivalent to the upper compound semiconductor layer.

Fifth Embodiment

Figure 5:
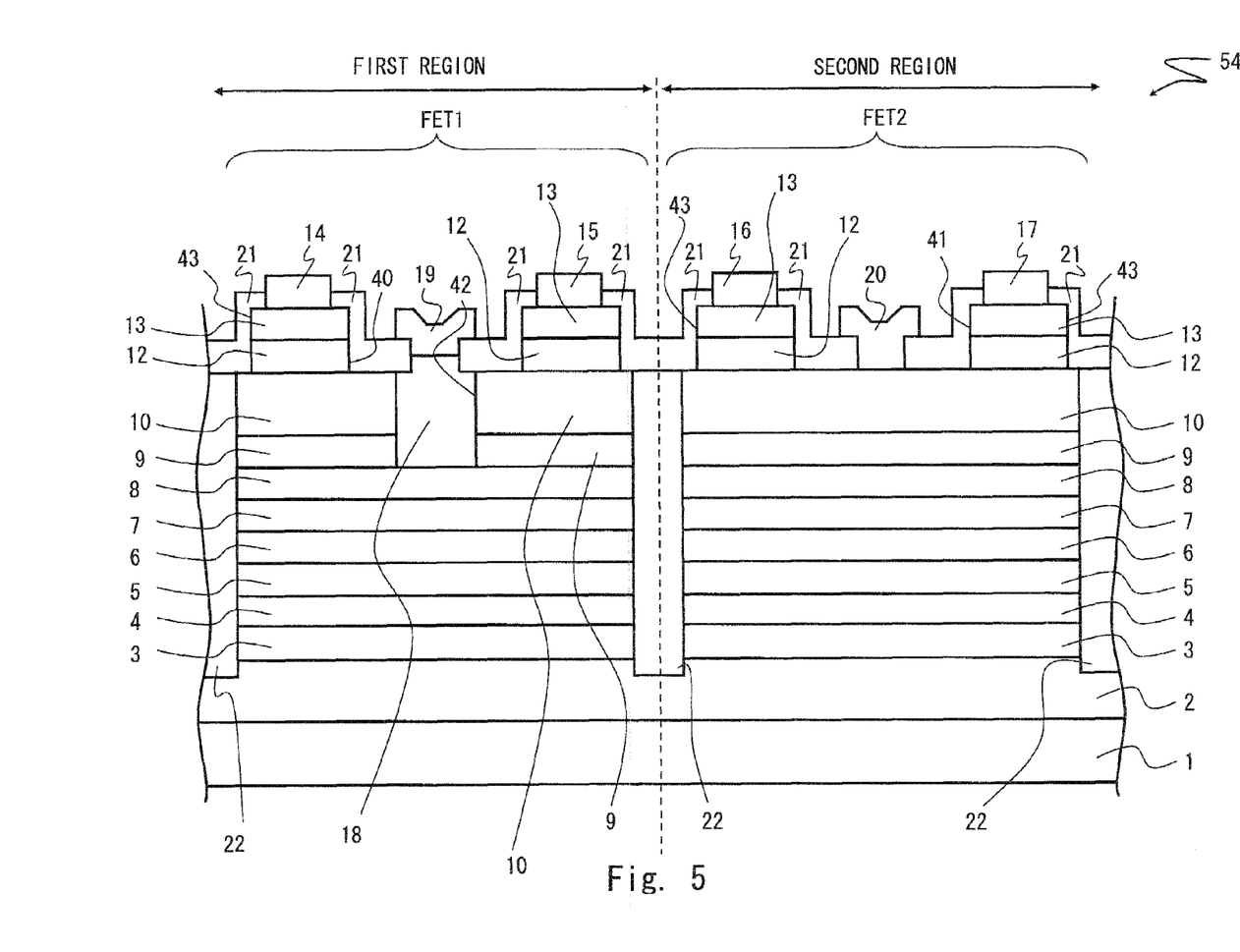
FIG. 5 is a schematic diagram for explaining schematically the cross-sectional configuration of a semiconductor device 54 according to a fifth embodiment.

A semiconductor device 54 according to a fifth embodiment is explained next with reference to FIG. 5. FIG. 5 is a schematic diagram for explaining schematically the cross-sectional configuration of the semiconductor device 54.

In the present embodiment, unlike in the fourth embodiment, the compound semiconductor layer 18 is formed in the second recess 42 formed in the GaAs layer (interlayer) 9 and the InGaP layer (stopper layer) 10, as illustrated in FIG. 5. That is, the compound semiconductor layer 18 is provided on top of the AlGaAs layer (interlayer) 8. In this case as well there is obtained the same effect as in the fourth embodiment. Herein, the threshold voltage of the FET 1 is +0.5 V while the threshold voltage of the FET 2 is −0.6 V. The InGaP layer 10 corresponds to the upper compound semiconductor layer.

Sixth Embodiment

Figure 6:
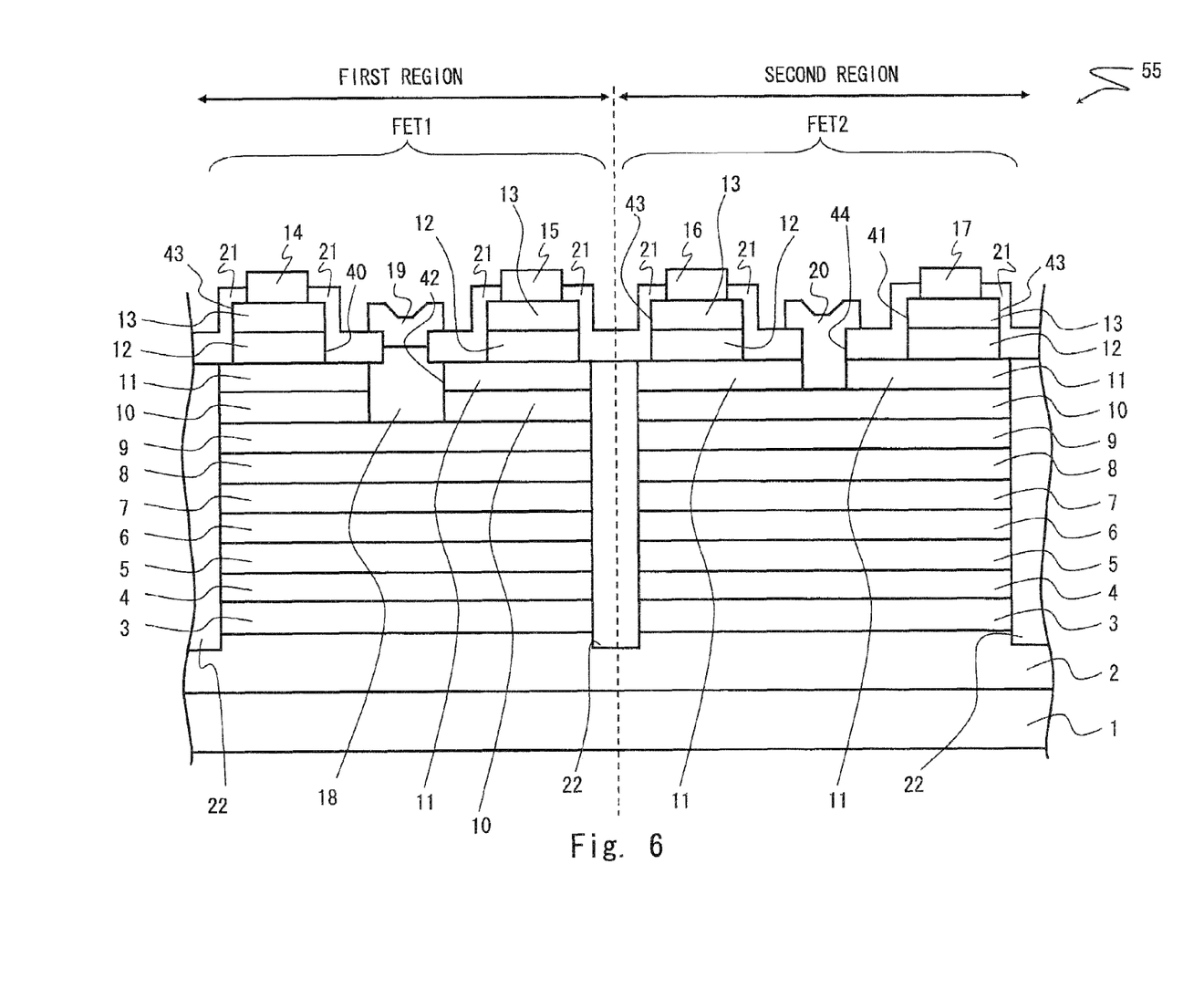
FIG. 6 is a schematic diagram for explaining schematically the cross-sectional configuration of a semiconductor device 55 according to a sixth embodiment.

A semiconductor device 55 according to a sixth embodiment is explained next with reference to FIG. 6. FIG. 6 is a schematic diagram for explaining schematically the cross-sectional configuration of the semiconductor device 55.

In the present embodiment, unlike in the first embodiment, the gate electrode 20 of the FET 2 is formed in a second recess 44, as illustrated in FIG. 6. The second recess 44 is a groove formed through selective etching of the interlayer 11. The layer thickness of the interlayer 11 is 5 nm. The layer thickness of the interlayer 10 is 20 nm.

In addition to the effect afforded in the first embodiment, the above configuration allows also reducing the on-resistance of the FET 2. This allows, as a result, further reducing the insertion loss of the switching circuit. This is because the electron density accumulated in the channel of the FET 2 can be increased through removal of the influence of the depletion layer formed in the vicinity of the surface of the semiconductor device 55, thanks to the gate electrode 20 being embedded in the compound semiconductor layer (interlayer 11).

Herein, the threshold voltage of the FET 1 is 0.4 V while the threshold voltage of the FET 2 is −0.6 V, so that the threshold voltage difference between the FET 1 and the FET 2 can be set to 1 V. The gate breakdown voltage of the FET 1 was 16 V.

Seventh Embodiment

Figure 7:
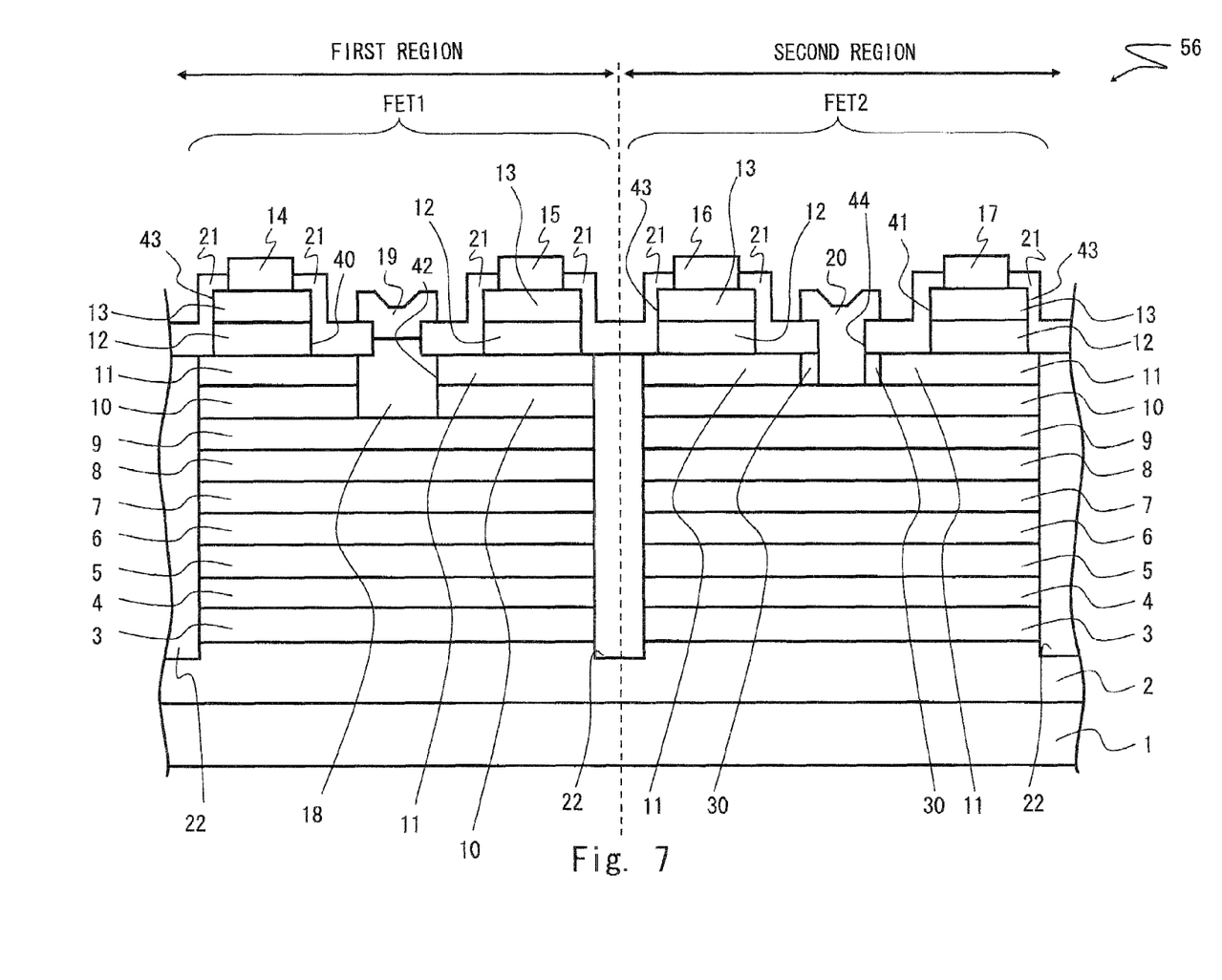
FIG. 7 is a schematic diagram for explaining schematically the cross-sectional configuration of a semiconductor device 56 according to a seventh embodiment.

A semiconductor device 56 according to a seventh embodiment is explained next with reference to FIG. 7. FIG. 7 is a schematic diagram for explaining schematically the cross-sectional configuration of the semiconductor device 56.

In the present embodiment, unlike in the sixth embodiment, a space 30 is formed between the side faces of the gate electrode 20 and the interlayer 11 as shown in FIG. 7.

In addition to the effect afforded in the sixth embodiment, the above configuration allows also reducing the electric field intensity that is applied at the gate of the FET 2 while increasing the gate breakdown voltage of the FET 2. The gap between the side faces of the gate electrode 20 and the interlayer 11 may be set to 20 nm to 60 nm.

Test evaluations show that a gap of 30 nm allowed setting the gate breakdown electrode of the FET 2 to 18 V. Moreover, the on-resistance of the FET 2 could be reduced by 10% vis-à-vis that of the first embodiment.

Eighth Embodiment

Figure 8:
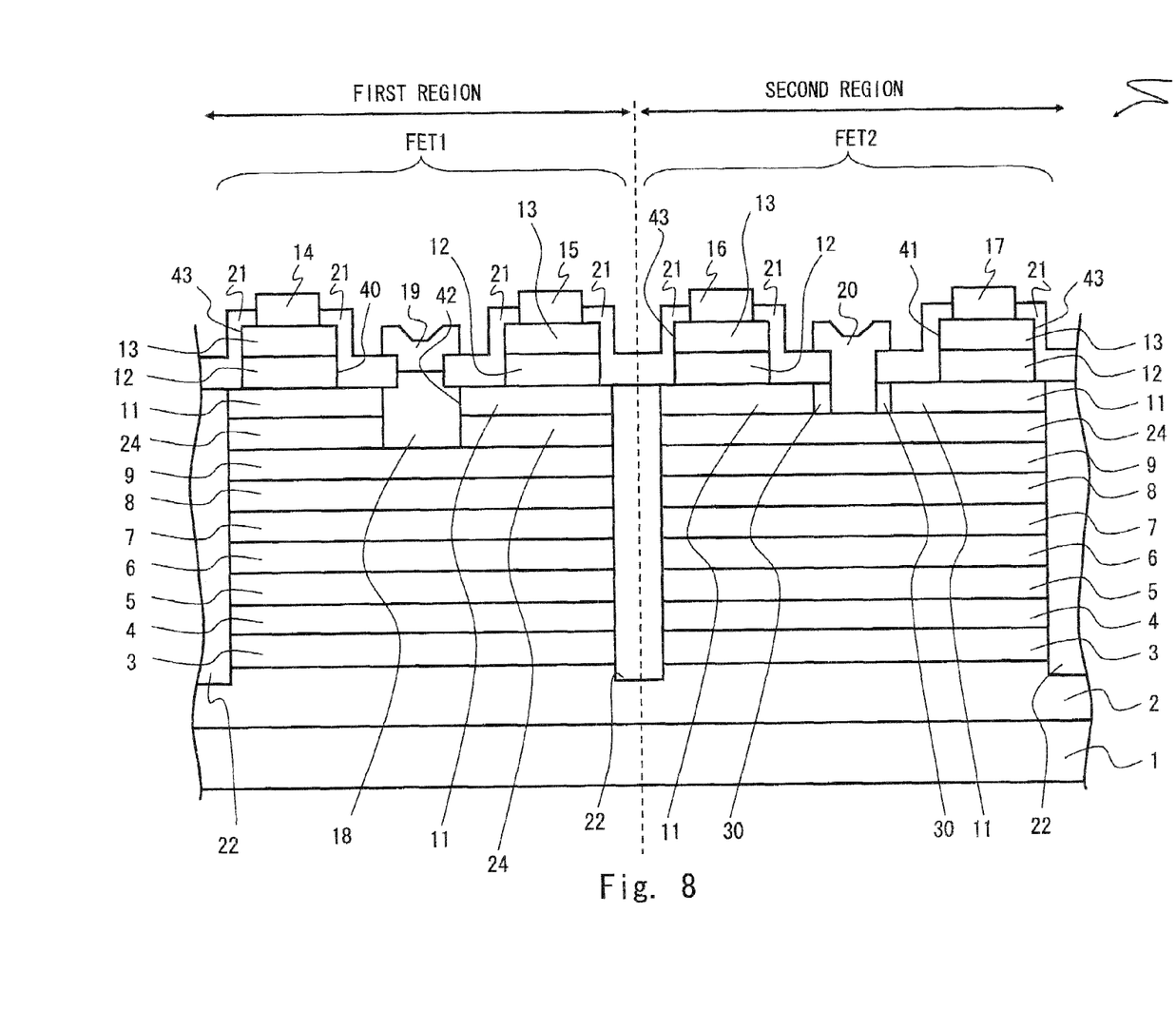
FIG. 8 is a schematic diagram for explaining schematically the cross-sectional configuration of a semiconductor device 57 according to an eighth embodiment.

A semiconductor device 57 according to an eighth embodiment is explained next with reference to FIG. 8. FIG. 8 is a schematic diagram for explaining schematically the cross-sectional configuration of the semiconductor device 57.

In the present embodiment, unlike in the seventh embodiment, the gate electrode 20 is in Schottky contact with an AlGaAs layer 24. In this case as well there is obtained the same effect as in the seventh embodiment. However, the Schottky barrier of the AlGaAs layer 24 is higher by 0.2 V, than that of an InGaP layer, and hence the AlGaAs layer 24 must be made thicker to achieve the same negative threshold voltage. In order to curb an increase in layer thickness, therefore, the gate electrode 20 may be brought into Schottky contact with a GaAs layer or an InGaP layer having a lower Schottky barrier than an AlGaAs layer.

Ninth Embodiment

Figure 9:
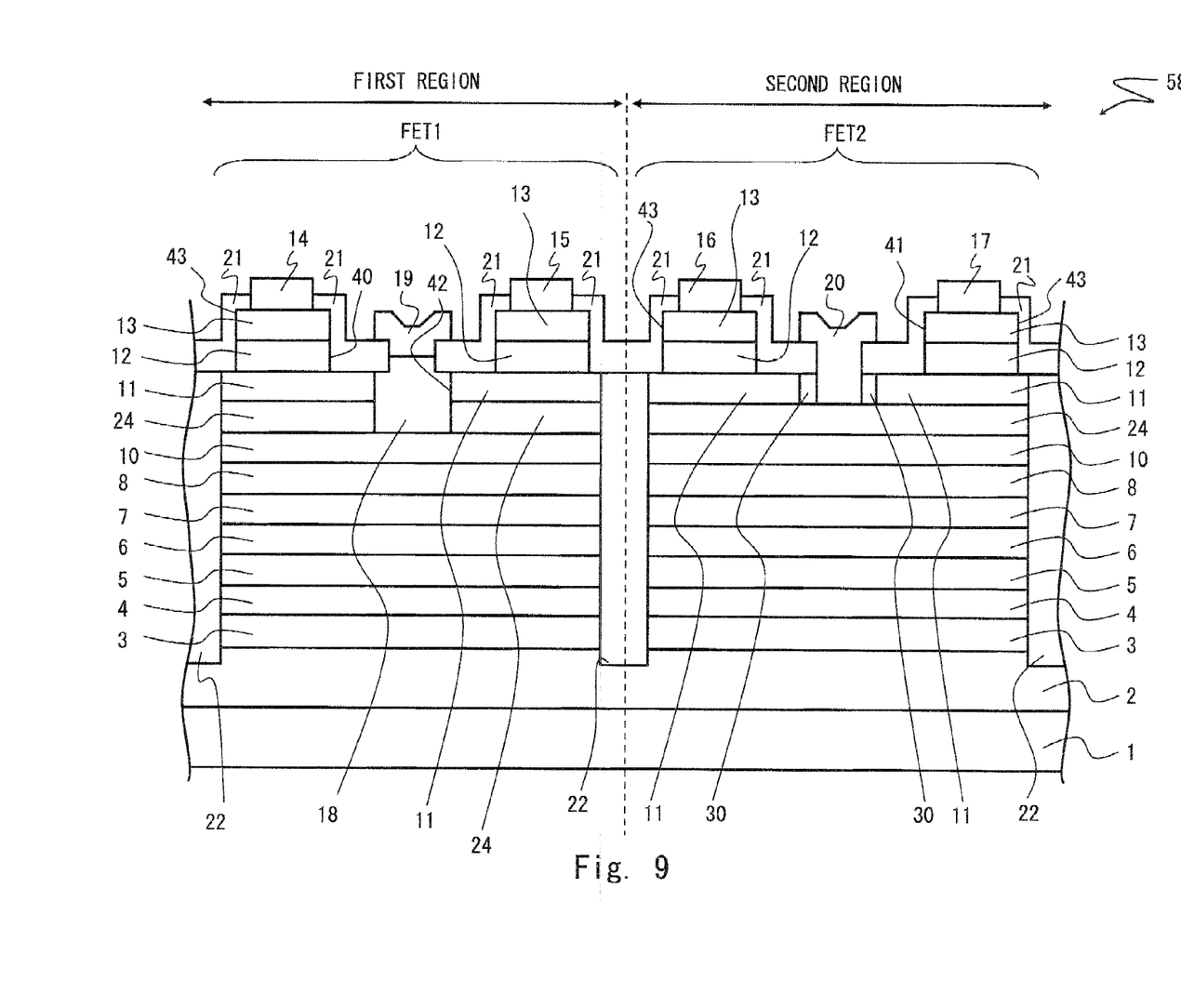
FIG. 9 is a schematic diagram for explaining schematically the cross-sectional configuration of a semiconductor device 58 according to a ninth embodiment.

A semiconductor device 58 according to a ninth embodiment is explained next with reference to FIG. 9. FIG. 9 is a schematic diagram for explaining schematically the cross-sectional configuration of the semiconductor device 58.

In the present embodiment, unlike in the eighth embodiment, the compound semiconductor layer 18 is formed on an InGaP layer 10. In this case as well there is obtained the same effect as in the eighth embodiment.

Tenth Embodiment

Figure 10:
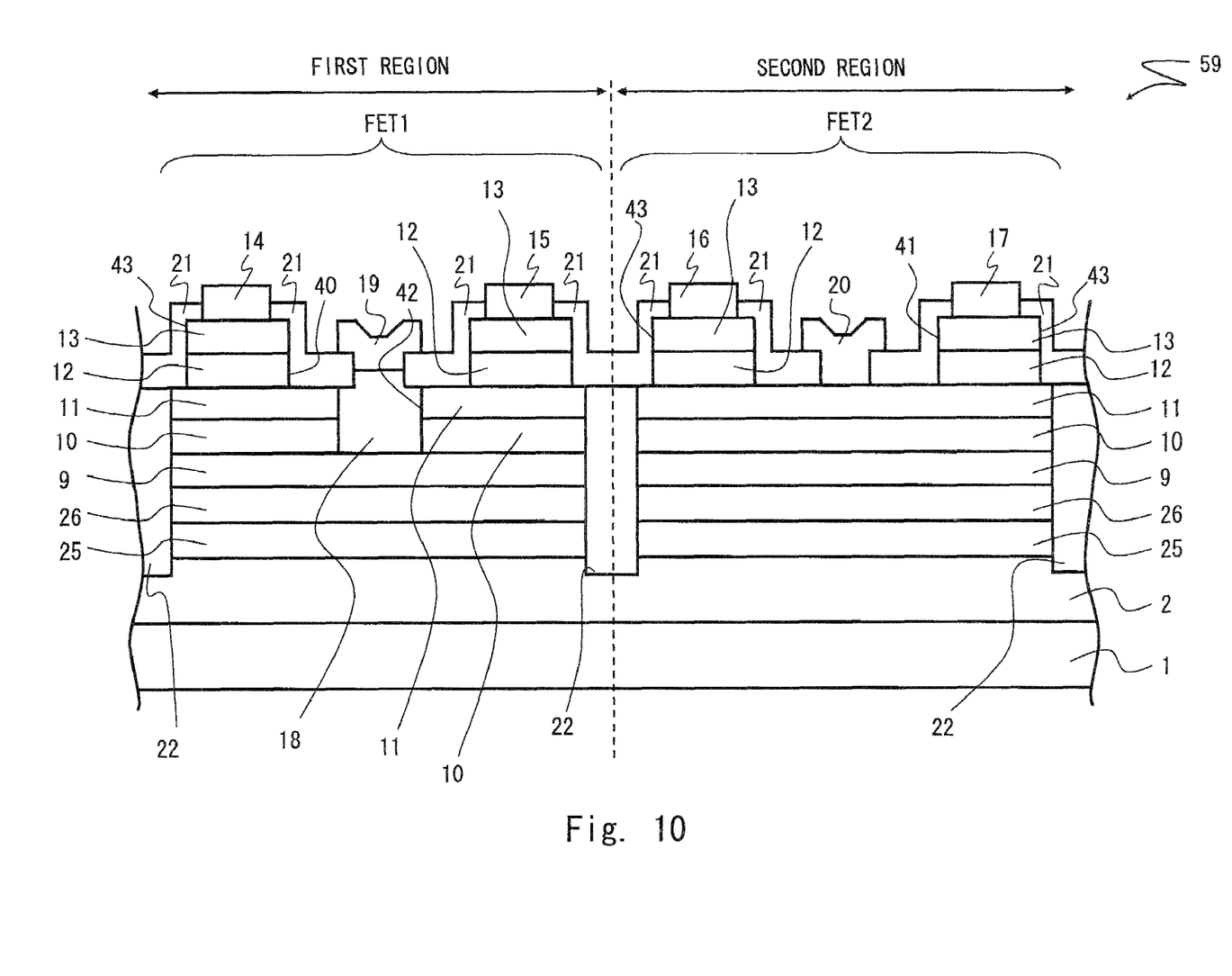
FIG. 10 is a schematic diagram for explaining schematically the cross-sectional configuration of a semiconductor device 59 according to a tenth embodiment.

A semiconductor device 59 according to a tenth embodiment is explained next with reference to FIG. 10. FIG. 10 is a schematic diagram for explaining schematically the cross-sectional configuration of the semiconductor device 59.

In the present embodiment, in particular, the configuration of the channel layer is different from that of the first embodiment. In this case as well there is obtained the same effect as in the eighth embodiment.

In the present embodiment, as illustrated in FIG. 10, a GaAs layer 25 and an AlGaAs layer 26 are formed in this order on the buffer layer 2. The GaAs layer 25 is doped with Si. The AlGaAs layer 26 is likewise doped with Si. The interlayer 9 is formed on the AlGaAs layer 26.

The technical scope of the present invention is not limited to the above embodiments. Specifically, the compound semiconductor layer 18 may be formed by impurity diffusion, instead of selective growth. That is, the compound semiconductor layer 18 may be formed by thermal diffusion of an impurity (Zn) on an upper compound semiconductor layer (the interlayer 11 in FIG. 1). The element implanted as an impurity may be any among, for instance, C, Zn and Mg. The compound semiconductor layer 18, moreover, is not limited to a GaAs layer, and may be another III-V group compound semiconductor layer (for instance, an AlGaAs layer). Also, the material of the electrodes (electrodes 19, 20) may be any material other than WSi, for instance a metal such as Ti, Al, Pt or the like. The above embodiments have been explained for a compound semiconductor layer having a composition lattice-matched to a GaAs substrate, but the embodiments are also applicable to InP compound semiconductors and GaN compound semiconductors.

It is apparent that the present invention is not limited to the above embodiments, but may be modified and changed without departing from the scope and spirit of the invention.

What is claimed is:

1. A semiconductor device, comprising:
a substrate common to a first field effect transistor and a second field effect transistor;
a channel layer of a first conductivity type formed on the substrate and common to the first and second field effect transistors;
an upper compound semiconductor layer formed on the channel layer and common to the first and second field effect transistors;
a compound semiconductor region of a second conductivity type formed in the same layer as the upper compound semiconductor layer;
a gate electrode of the first field effect transistor in ohmic contact with the compound semiconductor region at a position spaced apart from said upper compound semiconductor layer; and
a gate electrode of the second field effect transistor in Schottky contact with the upper compound semiconductor layer.

2. The semiconductor device according to claim 1, further comprising:
an isolation layer for electrically isolating the first field effect transistor and the second field effect transistor.

3. The semiconductor device according to claim 1, further comprising:
an electron supply layer common to the first and second field effect transistor; and
a spacer layer formed between the channel layer and the electron supply layer and common to the first and second field effect transistors.

4. The semiconductor device according to claim 1, wherein the compound semiconductor region of second conductivity type is a regrown compound semiconductor layer that is deposited in a recess provided in the upper compound semiconductor layer.

5. The semiconductor device according to claim 1, wherein the gate electrode of the second field effect transistor has a portion embedded in a recess provided in the upper compound semiconductor layer.

6. The semiconductor device according to claim 5, wherein the gate electrode of the second field effect transistor does not abut the inner wall of the recess provided in the upper compound semiconductor layer.

7. The semiconductor device according to claim 1, wherein the first field effect transistor is an enhancement-mode field effect transistor, and the second field effect transistor is a depletion-mode field effect transistor.

8. The semiconductor device according to claim 1, wherein the first field effect transistor is a field effect transistor for a power amplifier circuit, and the second field effect transistor is a field effect transistor for a switching circuit.

9. The semiconductor device according to claim 1, wherein an impurity concentration in the compound semiconductor region is set such that a potential barrier corresponding to a bandgap of the compound semiconductor region becomes greater than a potential barrier corresponding to a Schottky junction between the gate electrode of the second field effect transistor and the upper compound semiconductor layer.

10. The semiconductor device according to claim 1, wherein the upper compound semiconductor layer is a first conductivity type layer and the compound semiconductor region is a second conductivity type region.

11. The semiconductor device according to claim 1, wherein the upper compound semiconductor layer is a P-type layer and the compound semiconductor region is a N-type region.

12. The semiconductor device according to claim 9, wherein the upper compound semiconductor layer is a first conductivity type layer and the compound semiconductor region is a second conductivity type region.

13. The semiconductor device according to claim 9, wherein the upper compound semiconductor layer is a P-type layer and the compound semiconductor region is a N-type region.

14. The semiconductor device according to claim 3, wherein an impurity concentration in the compound semiconductor region is greater than an impurity concentration in the electron supply layer.

15. The semiconductor device according to claim 1, wherein a potential barrier corresponding to a bandgap of the compound semiconductor region is greater than a potential barrier corresponding to a Schottky junction between the gate electrode of the second field effect transistor and the upper compound semiconductor layer.

* * * * *